(12) United States Patent
Yasukawa et al.

(10) Patent No.: US 6,831,305 B2
(45) Date of Patent: Dec. 14, 2004

(54) SEMICONDUCTOR LIGHT-EMITTING DEVICE

(75) Inventors: Takemasa Yasukawa, Nishikasugai-gun (JP); Toshiya Uemura, Nishikasugai-gun (JP); Hideki Mori, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 212 days.

(21) Appl. No.: 10/119,113

(22) Filed: Apr. 10, 2002

(65) Prior Publication Data

US 2003/0098460 A1 May 29, 2003

(30) Foreign Application Priority Data

Apr. 23, 2001 (JP) ..................................... P2001-125136

(51) Int. Cl.$^7$ ........................ H01L 33/00; H01L 27/00
(52) U.S. Cl. ........................ 257/99; 257/79; 257/98; 257/100; 257/103
(58) Field of Search ................. 257/79–103; 372/43–50

(56) References Cited

U.S. PATENT DOCUMENTS

| | | | | |
|---|---|---|---|---|
| 3,609,475 A | * | 9/1971 | Kaposhilin | .................. 257/99 |
| 6,084,250 A | * | 7/2000 | Justel et al. | .................. 257/89 |
| 6,274,890 B1 | * | 8/2001 | Oshio et al. | .................. 257/98 |
| 6,337,536 B1 | * | 1/2002 | Matsubara et al. | ......... 313/498 |
| 6,696,704 B1 | * | 2/2004 | Maeda et al. | ................. 257/98 |

FOREIGN PATENT DOCUMENTS

| | | |
|---|---|---|
| JP | 11-220167 | 8/1999 |
| KR | 1995-960 | 2/1995 |

OTHER PUBLICATIONS

Korean Office Action dated Jun. 28, 2004.

* cited by examiner

*Primary Examiner*—Minhloan Tran
*Assistant Examiner*—Johannes Mondt
(74) *Attorney, Agent, or Firm*—McGinn & Gibb, PLLC

(57) ABSTRACT

A group III nitride compound semiconductor light-emitting element of a flip chip bonding type for emitting light with a wavelength not longer than 400 nm is coupled to a Zener diode, and the light-emitting element and the Zener diode coupled to each other are sealed with a metal casing having a window.

12 Claims, 6 Drawing Sheets

SEMICONDUCTOR LIGHT-EMITTING DEVICE

The present application is based on Japanese Patent Application No. 2001-125136, which is incorporated herein by reference.

BACKGROUND OF THE INVENTION

1. Field of the Invention

The present invention relates to a semiconductor light-emitting device.

2. Description of the Related Art

Recently, in order to excite a photocatalyst in an air purifier of an automobile, a light-emitting device (LED) emitting ultraviolet light is utilized. This LED has a configuration in which numbers of group III nitride compound semiconductor light-emitting elements are mounted on an exclusive design substrate and sealed with a light-transmissive resin such as a silicone resin.

In the case where such an air purifier is developed for house use, the volume of air treatment increases largely. Accordingly, the light quantity of ultraviolet rays required for the photocatalyst also increases. As a result, a high light output is required of each LED. It can be considered that the required high light output of the LEDs may be carried out by increasing the number of LEDs. This consideration is not preferable because the increase of the number of parts causes an increase in cost.

According to the investigation conducted by the present inventors, it has been found that following problems arise when the light output of the related-art LED is made large.

With the increase of the light quantity, discoloration (yellowing) of a sealing resin generally used is accelerated so that a sufficient lifetime of the related-art LED cannot be ensured.

There is a possibility that an air purifier for house use is used at a high humidity compared with that for vehicle house. The air purifier for house use is therefore impossible to obtain sufficient damp-proof effects when a silicone resin effective in resistance to discoloration is used.

Further, in order to expand the market of LED into general household articles, it is not preferable to use an exclusive design substrate, but it is preferable to use a substrate in same assembling method as a general round type lamp. Further, in order to prevent the light-emitting element from being degraded due to static electricity in the assembling step, it is necessary to surely cut off the reverse current so as not to flow into the light-emitting element.

SUMMARY OF THE INVENTION

It is an object of this invention to solve at least one of these problems.

It is another object of this invention to provide a light-emitting device which has high reliability in operation and which can achieve a long lifetime.

The configuration of the light-emitting device according to this invention is as follows: a semiconductor light-emitting device having: a group III nitride compound semiconductor light-emitting element subjected to flip chip bonding for emitting light with a wavelength not longer than 400 nm; a Zener diode coupled to the light-emitting element; and a metal casing having a window and for sealing the light-emitting element and the Zener diode.

In the light-emitting device having such a configuration, a group III nitride compound semiconductor light-emitting element is subjected to flip chip bonding so that light can be extracted from the light-emitting element to the outside with high efficiency. By using a Zener diode, a reverse current can surely prevented from flowing into the light-emitting element. Accordingly, not only can the light-emitting device be produced in an ordinary assembling step but also the reliability and durability of the light-emitting device per se can be improved. Further, when the light-emitting element is sealed with a metal casing, any influence of the external environment (particular humidity) giving to the light-emitting element can be blocked. Accordingly, reliability and durability of the light-emitting device are improved. On the other hand, the use of the sealing resin can be omitted due to the use of the metal casing. In such a manner, the problem of discoloration can be solved. Further, according to the invention, the light-emitting element is coated with a silicone resin high in resistance to discoloration against short-wave light radiation. By using the silicone resin higher in refractive index than air, the light is more easily emitted, thus, the light output efficiency is improved. Further, the mechanical strength of the light-emitting device is also improved.

Features and advantages of the invention will be evident from the following detailed description of the preferred embodiments described in conjunction with the attached drawings.

DETAILED DESCRIPTION OF THE PREFERRED EMBODIMENTS

Hereinafter, the invention will be described in detail.

As a group III nitride compound semiconductor light-emitting element for emitting light with a wavelength not longer than 400 nm, a semiconductor light-emitting element proposed in the related art may be used as it is.

Figure 1:
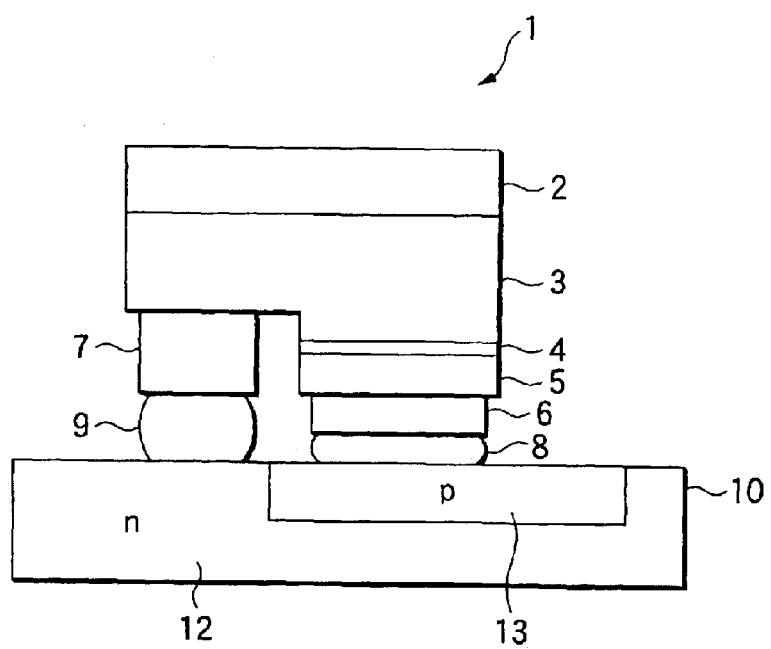
FIG. 1 is a sectional view showing a mode of coupling a light-emitting element and a Zener diode to each other according to an embodiment of the invention.

The group III nitride compound semiconductor light-emitting element 1 according to the invention, for example as shown in FIG. 1, has a semiconductor configuration in which an n-type layer 3, a multiple layer 4 including a light-emitting layer, and a p-type layer 5 are laminated in order on a substrate 2. A p electrode 6 is formed on the p-type layer 5, and an n electrode 7 is formed, on the n-type layer 3 exposed by etching. The p electrode 6 is coupled to a p-region 13 of a Zener diode 10 through a bonding material 8 such as a gold bump. The n electrode 7 is also coupled to an n-region 12 of the Zener diode 10 through a bonding material 9. A light-emitting element subjected to flip-chip bonding thus is a light-emitting element mounted on a support on a mount surface in the side where the p-type and n electrodes are formed. Light emitted from a light-emitting element subjected to flip-chip bonding is radiated from the substrate side, that is, from the side opposite to the electrode-forming side.

In this specification, each group III nitride compound semiconductor is represented by the general formula: $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ (here, $0<x<1$) The group III elements may be partially replaced by boron (B), or thallium (Tl) . The nitrogen (N) may be partially replaced by phosphorus (P), arsenic (As), antimony (Sb), or bismuth (Bi). The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace. The method for forming each group III nitride compound semiconductor layer is not particularly limited. For example, the group III nitride compound semiconductor layer may be formed by a metal organic chemical vapor deposition method (MOCVD method) or may be formed by a well known method such as a molecular beam epitaxy method (MBE method), a halide vapor phase epitaxy method (HVPE method), a sputtering method, an ion-plating method, an electron showering method, etc.

Incidentally, as the configuration of a light-emitting element, one which has a MIS junction, a PIN junction or a pn junction, or one which has a homo type structure, a hetero type structure, or a double hetero type structure may be used. Further, a quantum well structure (a single quantum well structure or a multiple quantum well structure) may be employed A Zener diode has a function to prevent a reverse current from flowing into the light-emitting element.

In the embodiment of the invention, the plate-like Zener diode is mounted on a bottom surface of a cup portion 35 of a stem 34 and the light-emitting element is directly coupled onto the Zener diode. Alternatively, the Zener diode and the light-emitting element may be separated from each other, while they are coupled to each other through a conductive wire.

Figure 2:
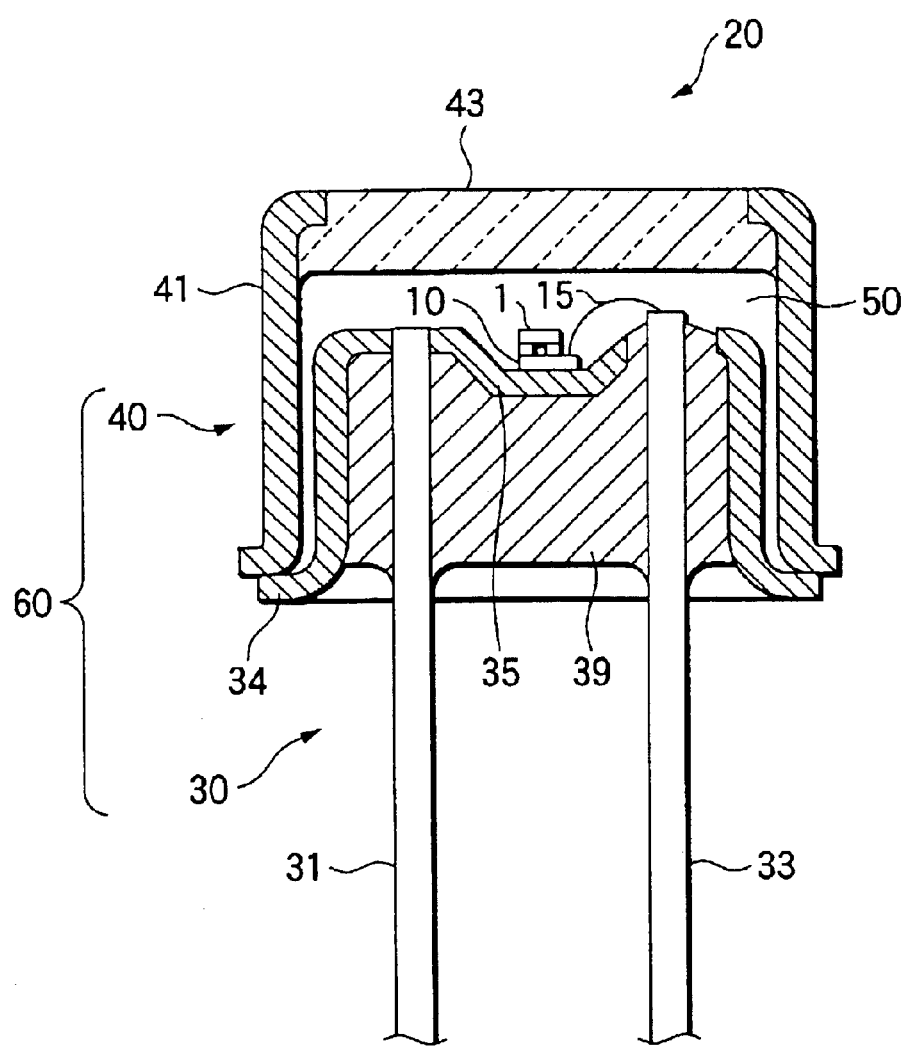
FIG. 2 is a sectional view showing the light-emitting element according to the embodiment.

As shown in FIG. 2, a metal casing 60 has a stem portion 30 and a cap portion 40, and the light-emitting element is sealed air-tightly with the metal casing 60. By use of the metal casing 60, it became unnecessary to use a sealing resin easily discolored such as an epoxy resin. It is preferable to purge the inside of the metal casing 60 with an inactive gas such as a nitrogen gas.

It is preferable that the circumferential surface of the cup portion 35 of the stem 34 is made to be a substantially mirror surface so as to have a high light reflecting efficiency. In order to make the circumferential surface be a mirror surface, it is preferable that metal plating is performed on the circumferential surface with gold or silver. Alternatively, white coating may be performed on the circumferential surface.

It is preferable that the inside of the cup portion 35 is filled with a light-transmissive material to thereby improve the light output efficiency from the light-emitting element and to thereby increase the mechanical stability of the light-emitting device. The light-transmissive material is selected to be a material which is difficult to be discolored by the light from the light-emitting element. Examples of the material may include a silicone resin and glass.

In the light-transmissive material, fluorescent substance maybe dispersed. In accordance with the fluorescent substance selected, the light emitted from the light-emitting layer can be changed into a desired color.

As the fluorescent substance for the light-emitting element having a peak wavelength in the vicinity of 380 nm, yttrium/aluminum/garnet:Ce, ZnS:Cu, Al, ZnS:Cu, Zn:Sn, and ZnS:Eu may be preferably used.

It is preferable that such fluorescent substance is dispersed uniformly in the light-transmissive material. In the light-transmissive material, a gradient may be provided in the dispersion density of the fluorescent substance, so that the gradient may be gradually changed or one-sided.

In place of the fluorescent substance, or together with the fluorescent substance, a dispersing agent such as mica may be blended in the light-transmissive material.

Hereunder, the configuration of the invention will be described more in detail by using an embodiment of the invention.

FIG. 2 is a sectional view showing the configuration of a light-emitting device 20 according to the embodiment. The light-emitting device 20 of the embodiment is configured briefly by a light-emitting element 1, a Zener diode 10, a metal casing 60 including a stem portion 30 and a cap portion 40.

FIG. 1 shows the coupling mode between the group III nitride compound semiconductor light-emitting element 1 and the Zener diode 10 according to the embodiment.

The light-emitting element 1 in the embodiment has a semiconductor configuration in which an n-type layer 3, a multiple layer 4 including a light-emitting layer, and a p-type layer 5 are laminated in order on a sapphire substrate 2. Each of the n-type and p-type layers 3 and 5 may be constituted by a plurality of layers if necessary. A quantum well structure is employed in the multiple layer 4 so that light with a wavelength about 380 nm is produced. A p electrode 6 is made of a gold alloy deposited substantially all over the surface area of the p-type layer 5. An n electrode 7 is made of an aluminum alloy deposited on the n-type layer 3 exposed by etching.

The p-type and n electrodes 6 and 7 of the light-emitting element 1 are connected to a p-region 13 and an n-region 12 of the Zener diode 10, respectively, through conductive bonding materials 8 and 9 made of gold bumps. As shown in FIG. 2, one end of a conductive wire 15 is bonded to the p-region 13, and the other end of the conductive wire 15 is bonded to a straight lead 33. Aback surface of the Zener diode 10 is connected to a bottom surface of a cup portion 35 of a stem 34 through the conductive bonding material. The stem 34 is welded to an earth lead 31. Accordingly, the n electrode 7 of the light-emitting element is electrically connected to the earth lead 31.

Figure 3A:
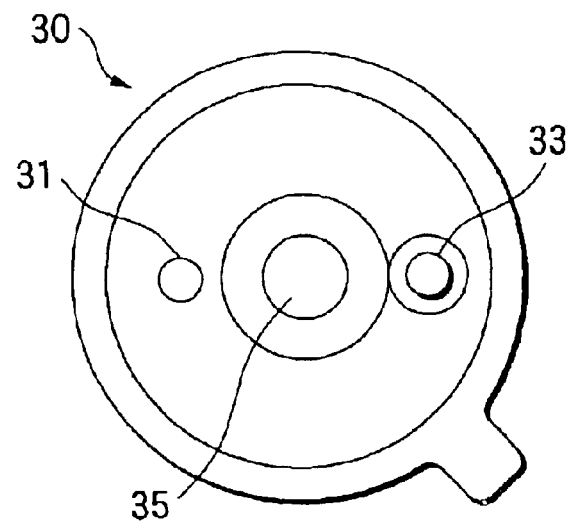
FIGS. 3A and 3B are drawings showing a configuration of a stem portion in the light-emitting device according to the embodiment, FIG. 3A being a plan view of the stem portion, FIG. 3B being a sectional view of the same.
Figure 3B:
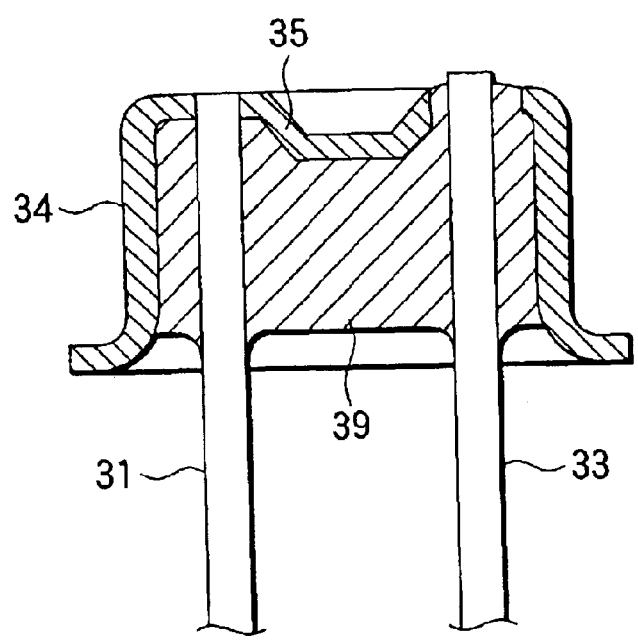

The stem portion 30 has, as shown in FIGS. 3A and 3B, the cap-like stem 34, the leads 31 and 33, and an insulator material 39. The stem 34 is recessed at its center portion so as to be formed into a parabolic shape (cup portion 35). The Zener diode 10 is fixed on the center of the bottom surface of the cup portion 35 and the light-emitting element 1 is stacked on the Zener diode 10. The stem 34 is press-molded of a conductive metal material and has a surface subjected to gold-plating. Two holes are formed in the stem 34, and the earth lead 31 is inserted through one of the two holes and welded to the stem 34. The straight lead 33 is inserted through the other hole and insulated from the stem 34 by the insulating material 39. As the insulating material 39, glass is employed.

Figure 4A:
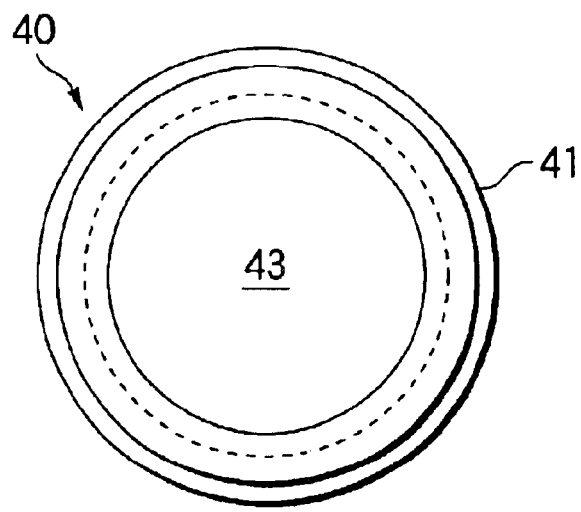
FIGS. 4A and 4B are drawings showing a configuration of a cap portion in the light-emitting device according to the embodiment, FIG. 4A being a plan view of the cap portion, FIG. 4B being a sectional view of the same.
Figure 4B:
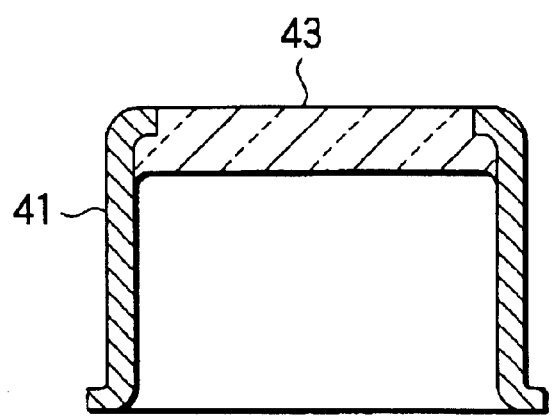

The cap portion 40 is provided with a shell portion 41 and a glass portion 43 (See FIG. 4). The shell portion 41 and the glass portion 43 are air-tightly connected with each other. The cap portion 40 is formed to be slightly larger in size than the stem 34. When the cap portion 40 is put on the stem 34 as shown in FIG. 2, a suitable space 50 is formed between the cap portion 40 and the stem 34. The respective lower edges of the shell portion 41 and the stem 34 are welded with each other air-tightly. The space 50 is purged with nitrogen gas.

In the light-emitting device 20 configured thus according to the embodiment, the light produced in the multiple layer 4 of the light-emitting element 1 passes through the substrate 2 and directly goes to the outside, or the light goes to the outside after the light is reflected by the p electrode 6, further reflected by the front surface of the cup portion 35, and passes through the glass portion 43.

Because the glass portion 43 is made of an inorganic material, it is hardly discolored even if it receives short-wave light from the light-emitting element 1. Accordingly, the output of the light-emitting element 1 can be increased as much as possible. Further, the space 50 is air-tightly enclosed by the metallic stem 34 and the shell portion 41 and by the glass material portions 39 and 43. Accordingly, moisture as well as dust from the outside cannot invade the space 50 at all to give any influence on the light-emitting element 1.

Figure 5:
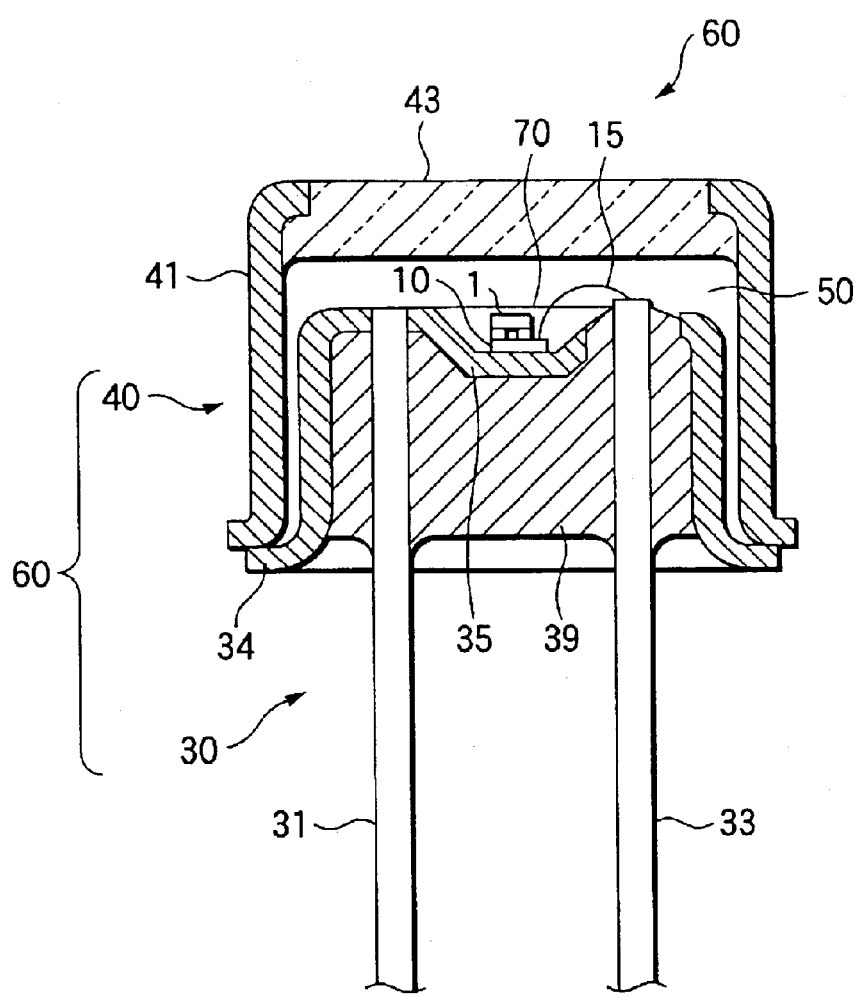
FIG. 5 is a sectional view showing the light-emitting device according to another embodiment.

FIG. 5 shows a light-emitting device 60 according to another embodiment. In FIG. 5, members the same as those in FIG. 2 are referenced correspondingly and the description of the members is omitted here.

In this embodiment, a silicone resin 70 is potted into the cup portion 35 of the stem portion 30 so as to protect the light-emitting element 1. In such a manner, the light output efficiency from the light-emitting element 1 is improved. Further, the mechanical strength can be improved at the coupling portion between the light-emitting element 1 and the Zener diode 10 and at the bonding portion between the Zener diode 10 and the conductive wire 15. Accordingly, the reliability as a light-emitting device is improved.

The silicone resin is an organic material which is the most difficult material to be discolored with respect to short-wave light such as ultraviolet rays.

Figure 6:
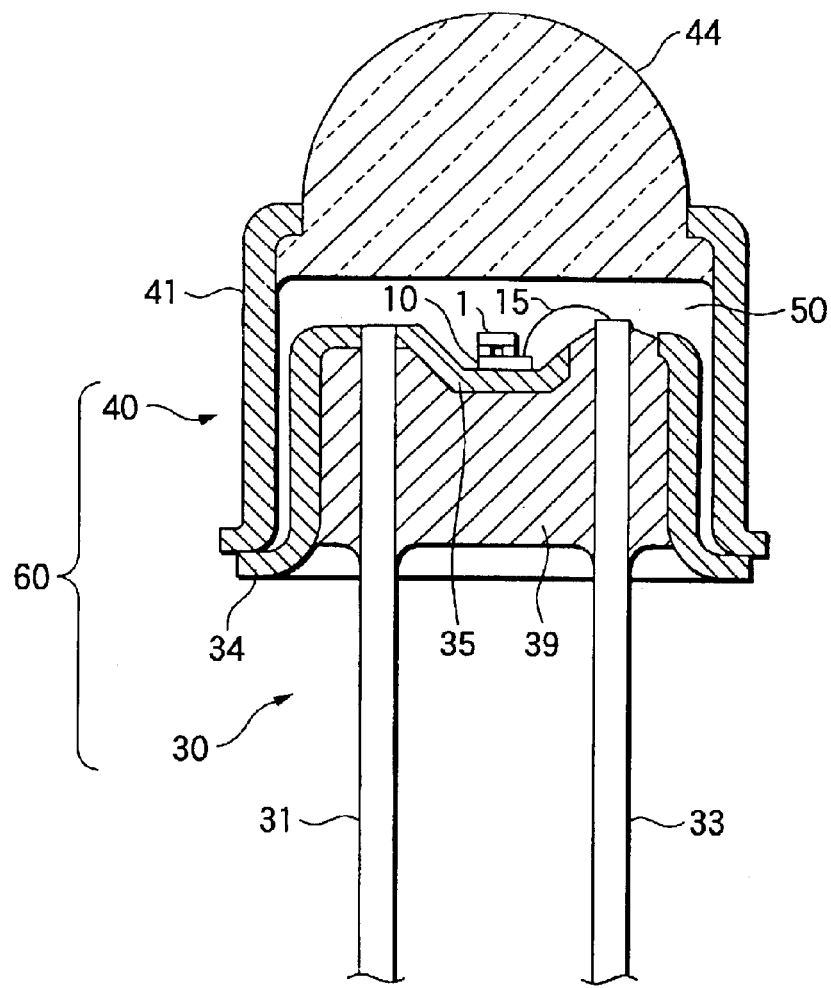
FIG. 6 is a sectional view showing the light-emitting device according to still another embodiment.

FIG. 6 shows a light-emitting device 80 according to still another embodiment. In FIG. 6, members the same as those in FIG. 2 are referenced correspondingly and the description of the members is omitted here.

In this embodiment, the glass portion is formed into a shape of a convex lens 44. The convex lens 44 plays as a role of light radiation surface. The light emitted from the light-emitting element 1 is condensed by the convex lens 44 and emitted to the outside with high efficiency.

The invention is not limited at all to the description made on the mode for carrying out the invention. Various modifications of the mode for carrying out the invention may be included to an extent that can be thought of by those skilled in the art without departing from the description of the scope for a patent.

What is claimed is:

1. A semiconductor light-emitting device comprising:
   a group III nitride compound semiconductor light-emitting element comprising a flip chip bonding light-emitting for emitting light with a wavelength equal to or less than 400 nm;
   a Zener diode coupled to said light-emitting element; and
   a metal casing including a window,
   wherein said metal casing seals said light-emitting element and said Zener diode from an outside of the metal casing, and wherein the light-emitting element is sealed with an inactive gas.

2. The semiconductor light-emitting device according to claim 1,
   wherein said Zener diode is disposed in a cup portion in a stem portion of said metal casing, and
   wherein said light-emitting element is disposed on said Zener diode.

3. The semiconductor light-emitting device according to claim 2, wherein said cup portion is filled with a silicone resin.

4. The semiconductor light-emitting device according to claim 2, wherein a circumferential surface of said cup portion comprises a substantially mirror surface.

5. The semiconductor light-emitting device according to claim 2,
   wherein said metal casing comprises said stem portion and a cap portion including said window and covering said stem portion, and
   wherein said light-emitting element and said Zener diode are disposed in a space between said stem portion and said cap portion.

6. A semiconductor light-emitting device according to claim 1,
   wherein the metal casing comprises a hollow space, and
   wherein the light-emitting element is sealed within the hollow space by the metal casing.

7. The semiconductor light-emitting devise according to claim 1, wherein the window comprises an inorganic material.

8. The semiconductor light-emitting devise according to claim 2, wherein the cup portion is filled with a material resistant to discoloration by the light emitted from the light-emitting element.

9. The semiconductor light-emitting devise according to claim 2, wherein the cup portion is filled with a material resistant to discoloration by ultraviolet light.

10. The semiconductor light-emitting devise according to claim 1, wherein the Zener diode prevents a reverse current from flowing into the light-emitting element.

11. The semiconductor light-emitting devise according to claim 1, wherein the Zener diode is coupled directly to the light-emitting element.

12. The semiconductor light-emitting devise according to claim 1, wherein a conductive wire electrically connects the Zener diode and the light-emitted element.

* * * * *